(12) United States Patent
Yeh et al.

(10) Patent No.: US 12,031,363 B2
(45) Date of Patent: Jul. 9, 2024

(54) HANDLE MECHANISM AND CASING ASSEMBLY INCLUDING THE SAME

(71) Applicant: Wiwynn Corporation, New Taipei (TW)

(72) Inventors: Ping Sheng Yeh, New Taipei (TW); Tingya Liao, New Taipei (TW); Ming Chih Kao, New Taipei (TW); Ming Feng Hsieh, New Taipei (TW)

(73) Assignee: WIWYNN CORPORATION, New Taipei (TW)

( * ) Notice: Subject to any disclaimer, the term of this patent is extended or adjusted under 35 U.S.C. 154(b) by 500 days.

(21) Appl. No.: 17/403,949

(22) Filed: Aug. 17, 2021

(65) Prior Publication Data
US 2022/0349225 A1 Nov. 3, 2022

(30) Foreign Application Priority Data
Apr. 29, 2021 (TW) .................................. 110115534

(51) Int. Cl.
*H05K 7/14* (2006.01)
*E05B 1/00* (2006.01)
(Continued)

(52) U.S. Cl.
CPC .............. *E05C 3/14* (2013.01); *E05B 1/0046* (2013.01); *G11B 33/123* (2013.01);
(Continued)

(58) Field of Classification Search
CPC .. G11B 33/123; H05K 5/0221; H05K 7/1409; H05K 7/1487
(Continued)

(56) References Cited

U.S. PATENT DOCUMENTS 6,067,225 A * 5/2000 Reznikov ............. H05K 7/1418
10,285,291 B1 * 5/2019 Lam ...................... H05K 7/1489
(Continued)

FOREIGN PATENT DOCUMENTS

CN      203120345 U     8/2013
CN      108811420 A  * 11/2018

OTHER PUBLICATIONS

TW Office Action dated Dec. 27, 2021 in Taiwan application No. 110115534.

*Primary Examiner* — Zhengfu J Feng
(74) *Attorney, Agent, or Firm* — McClure, Qualey & Rodack, LLP

(57) ABSTRACT

A handle mechanism is to be mounted on a slidable plate and to slide the slidable plate relative to a chassis. The handle mechanism includes a handle and an engagement component. The handle is adapted to be pivotably disposed on the slidable plate so as to have an engaged position and a disengaged position. The engagement component is slidably disposed on the handle and adapted to contact the chassis to slide the slidable plate into the chassis. The engagement component has a contact surface, and the contact surface has an edge located away from an axis of the handle. A distance between the edge of the contact surface of the engagement component and the axis of the handle in the engaged position is smaller than a distance between the edge of the contact surface of the engagement component and the axis of the handle in the disengaged position.

20 Claims, 12 Drawing Sheets

(51) Int. Cl.
*E05C 3/14* (2006.01)
*G11B 33/12* (2006.01)
*H05K 5/02* (2006.01)

(52) U.S. Cl.
CPC ......... *H05K 5/0221* (2013.01); *H05K 7/1409* (2013.01); *H05K 7/1487* (2013.01)

(58) Field of Classification Search
USPC .......................................................... 361/754
See application file for complete search history.

(56) References Cited

U.S. PATENT DOCUMENTS

| | | | | |
|---|---|---|---|---|
| 2004/0077198 | A1* | 4/2004 | Schlack | H05K 7/1409 439/160 |
| 2011/0212637 | A1* | 9/2011 | Colongo | H05K 7/1409 439/160 |
| 2015/0296649 | A1* | 10/2015 | Wang | H05K 7/1409 403/326 |
| 2020/0061800 | A1* | 2/2020 | Wu | B25G 3/08 |

\* cited by examiner

HANDLE MECHANISM AND CASING ASSEMBLY INCLUDING THE SAME

CROSS-REFERENCE TO RELATED APPLICATIONS

This non-provisional application claims priority under 35 U.S.C. § 119(a) on Patent Application No(s). 110115534 filed in Taiwan, R.O.C. on Apr. 29, 2021, the entire contents of which are hereby incorporated by reference.

TECHNICAL FIELD

The disclosure relates to a handle mechanism and a casing assembly including the same, more particularly to a handle mechanism having a slidable engagement component and a casing assembly including the same.

BACKGROUND

In the cloud technology field, the server plays a key role. The server can provide and implement various cloud services required by internet users, and the application of the server includes games, language processing, finance, biomedicine, searching engine, e-commerce, social network media and so on. In order to improve the quality and management of the service, the server may equip as many electronic components as possible in its interior space, and those electronic components are properly arranged. Under this circumstance, the electronic components of the server may be in a compact arrangement, the weight of the server may increase due to the increasing quantity of the electronic components, and the server rack may accommodate many servers simultaneously.

In general, the server is slidable relative to the server rack, and there is a handle disposed on the casing of the server for moving the server relative to the server rack, removing the server from the server rack, or installing the server on the server rack during the maintenance of the server. However, either the server is drawn out of the server rack or the server is pushed into the server rack, the handle is required to be in an opened state. Therefore, how to efficiently draw the server out of the server rack or push the server into the server rack is one of the crucial topics in this field.

SUMMARY OF THE INVENTION

The disclosure provides a handle mechanism and a casing assembly that enable convenient moving of a server casing for user.

One embodiment of the disclosure provides a handle mechanism. The handle mechanism is adapted to be mounted on a slidable plate and configured to slide the slidable plate relative to a chassis. The handle mechanism includes a handle and an engagement component. The handle is adapted to be pivotably disposed on the slidable plate so as to have an engaged position and a disengaged position. The engagement component is slidably disposed on the handle and adapted to contact the chassis to slide the slidable plate into the chassis. The engagement component has a contact surface, and the contact surface has an edge located away from an axis of the handle. A distance between the edge of the contact surface of the engagement component and the axis of the handle in the engaged position is smaller than a distance between the edge of the contact surface of the engagement component and the axis of the handle in the disengaged position.

Another embodiment of the disclosure provides a casing assembly. The casing assembly is adapted to be slidably disposed in a chassis. The casing assembly includes a tray and a handle mechanism. The tray is slidably disposed in the chassis. The handle mechanism includes a handle and an engagement component. The handle is adapted to be pivotably disposed on the tray so as to have an engaged position and a disengaged position. The engagement component is slidably disposed on the handle and adapted to contact the chassis to slide the tray into the chassis. The engagement component has a contact surface, and the contact surface has an edge located away from an axis of the handle. A distance between the edge of the contact surface of the engagement component and the axis of the handle in the engaged position is smaller than a distance between the edge of the contact surface of the engagement component and the axis of the handle in the disengaged position.

According to the handle mechanism and the casing assembly as disclosed above, the engagement component is slidably disposed on the handle, such that even the handle is in the engaged position, during the movement of the tray into the chassis, the chassis presses against the inclined surface of the engagement component so as to force the engagement component to move away, thereby preventing the engagement component from interfering with the chassis. After the engagement component is moved to align with an engagement hole of the chassis, the engagement component is inserted into the engagement hole of the chassis. Therefore, when the handle is in the engaged position, and the maintainer is inconvenient or does not want to open the handle, the tray can still be moved into the chassis without being blocked.

In addition, when the handle is pivoted toward the disengaged position from the engaged position, the distance between the edge of the contact surface of the engagement component and the axis of the handle gradually increase. Therefore, the movement distance of the tray into the chassis caused by operating the handle mechanism can be increased. On the other hand, when the handle is pivoted toward the engaged position from the disengaged position, the distance between the edge of the contact surface of the engagement component and the axis of the handle gradually decreases. Therefore, the engagement component can be prevented from hitting or having interference with a component nearby the chassis. Accordingly, the movement distance of the tray caused by operating the handle mechanism can be increased while achieving the effortless operation of the handle mechanism.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
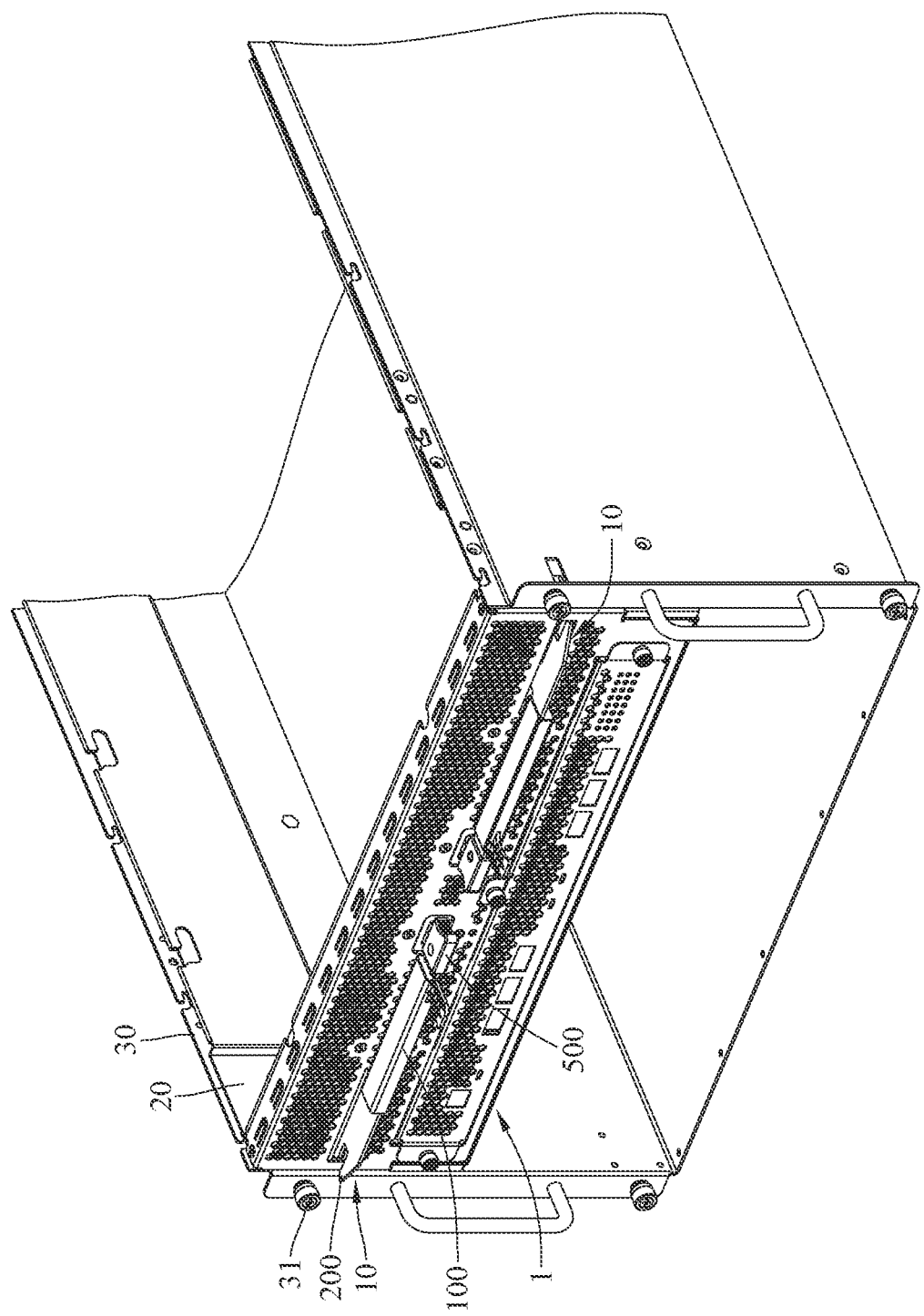
FIG. 1 is a perspective view of a casing assembly according to one embodiment of the disclosure and a chassis.
Figure 2:
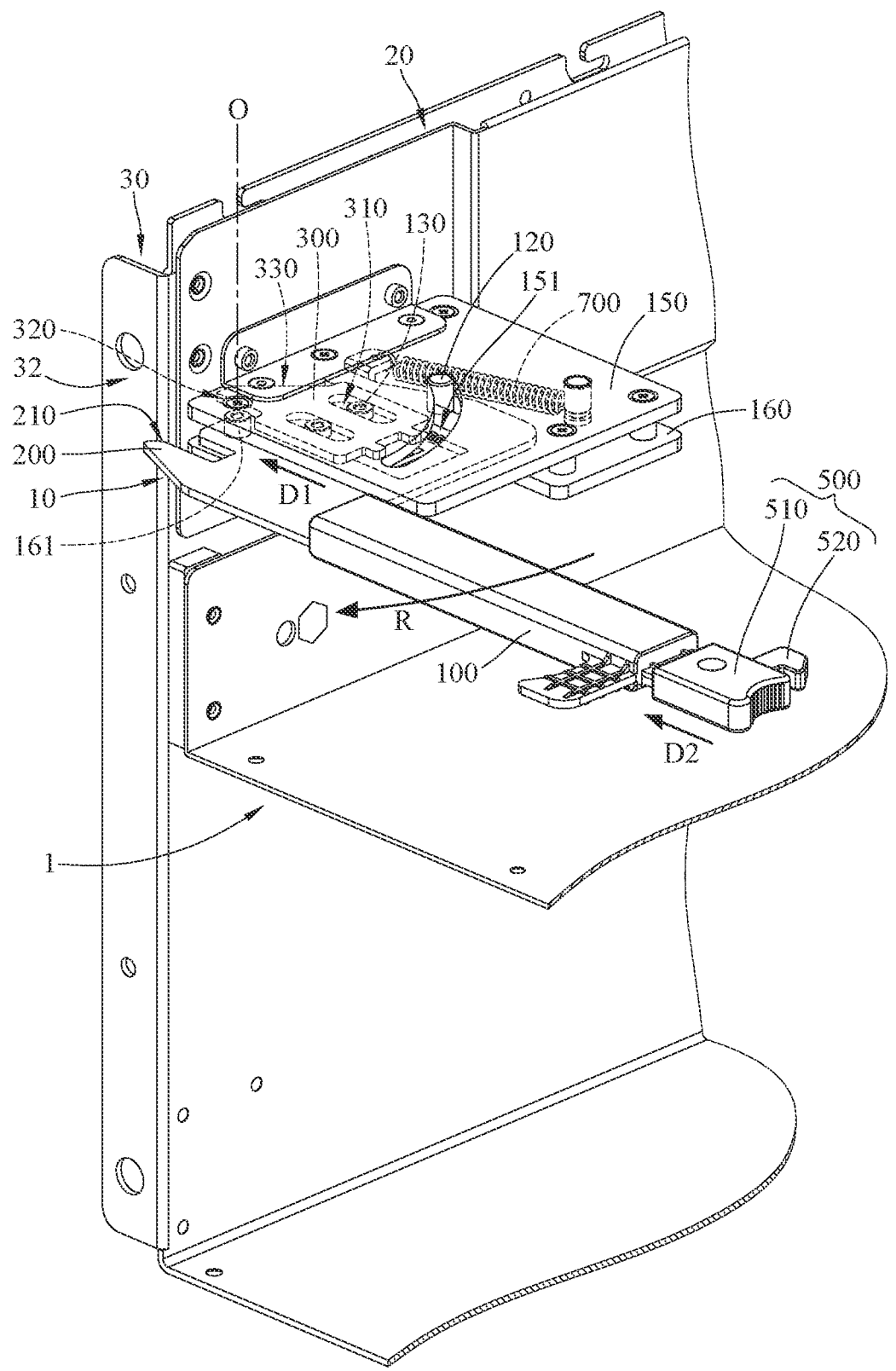
FIG. 2 is a partial perspective view of the casing assembly and the chassis in FIG. 1.
Figure 3:
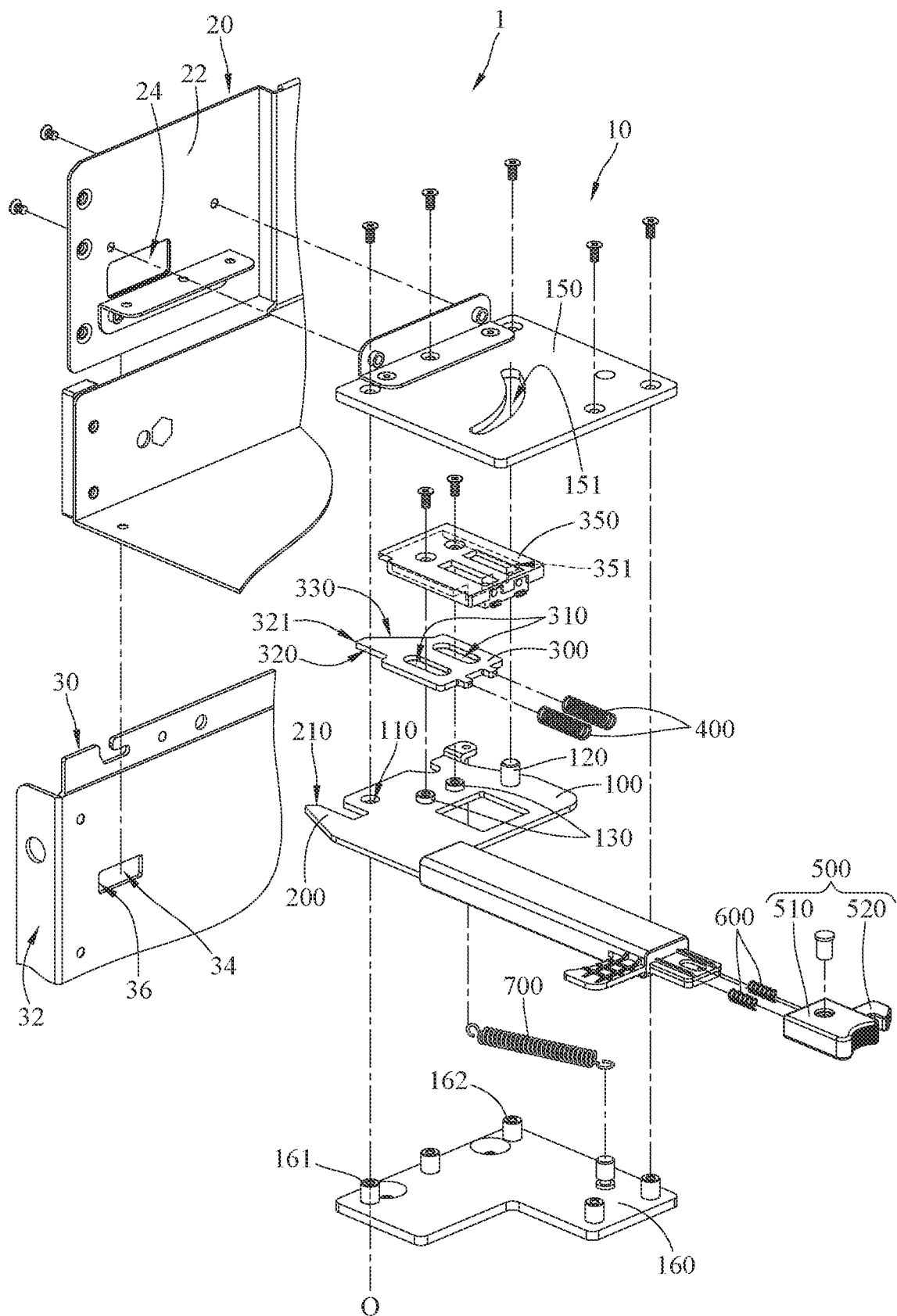
FIG. 3 is a partial exploded view of the casing assembly and the chassis in FIG. 2.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

The disclosure relates to a handle mechanism adapted to be mounted on a slidable structure so as to force it to slide relative to a static structure, where the static structure may be a chassis while the slidable structure may be a part of a tray slidably disposed on the chassis, but the disclosure is not limited thereto. In another application, the static structure may be a server rack while the slidable structure may be a server casing slidably disposed on the server rack; or, the static structure may be a server casing while the slidable structure may be a HDDs carrier slidably disposed on the server casing. The following paragraphs take one of the applications as an example for explaining the handle mechanism of the disclosure.

Referring to FIGS. 1 to 4, there are shown a perspective view of a casing assembly 1 and a chassis 30 according to one embodiment of the disclosure, a partial perspective view of the casing assembly 1 and the chassis 30, a partial exploded view of the casing assembly 1 and the chassis 30, and a cross-sectional view of the casing assembly 1 and the chassis 30.

As shown, the casing assembly 1 is slidably disposed on the chassis 30. The chassis 30 may be served as a server casing, and the casing assembly 1 is an assembly accommodated in the chassis 30 and can serve to support electronic components and devices, such as mother board, disk drives, and fans. In this embodiment, the chassis 30 may have a height of 6 U, and the casing assembly 1 may have a height of 3 U, but the present disclosure is not limited thereto; in some other embodiments, the chassis may have a height of 6 U while the height of the casing assembly is 1 U; alternatively, in another embodiment, the chassis and casing assembly may both have a height of 2 U. In this embodiment, the chassis 30 has a bent portion 32 and an engagement hole 34 separated from each other. The chassis 30 further has a contact surface 36 located at a side of the engagement hole 34 located close to the bent portion 32. The bent portion 32 can be fixed to a server rack by screws 31.

The casing assembly 1 includes a tray 20 and two handle mechanisms 10. The tray 20 is slidably disposed in the chassis 30 and is configured to support electronic components and devices, such as mother board, disk drives, and fans. The tray 20 has a slidable plate 22 and an opening 24 located at the slidable plate 22.

Figure 4:
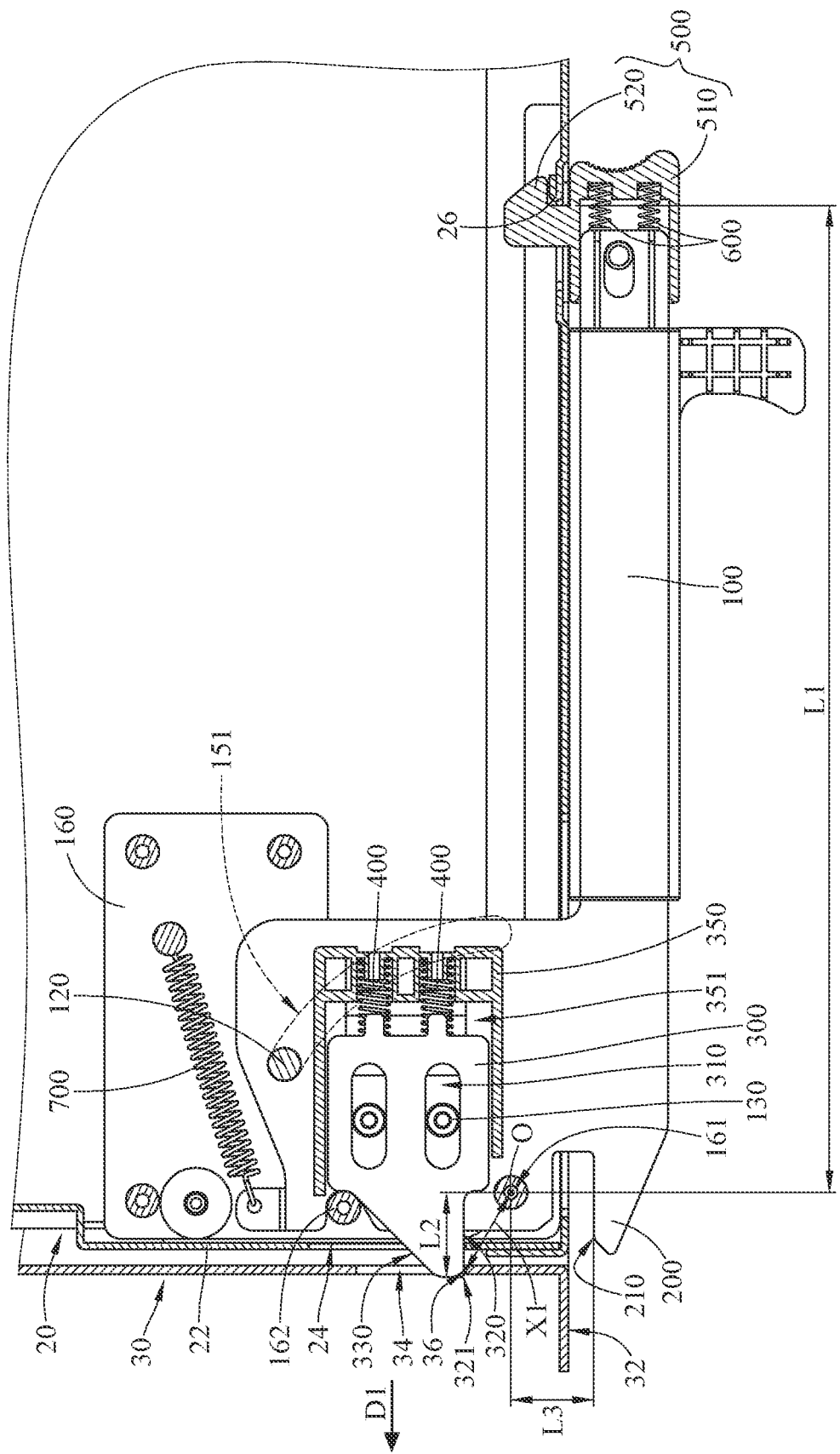
FIG. 4 is a cross-sectional view of the casing assembly and the chassis in FIG. 2.
Figure 8:
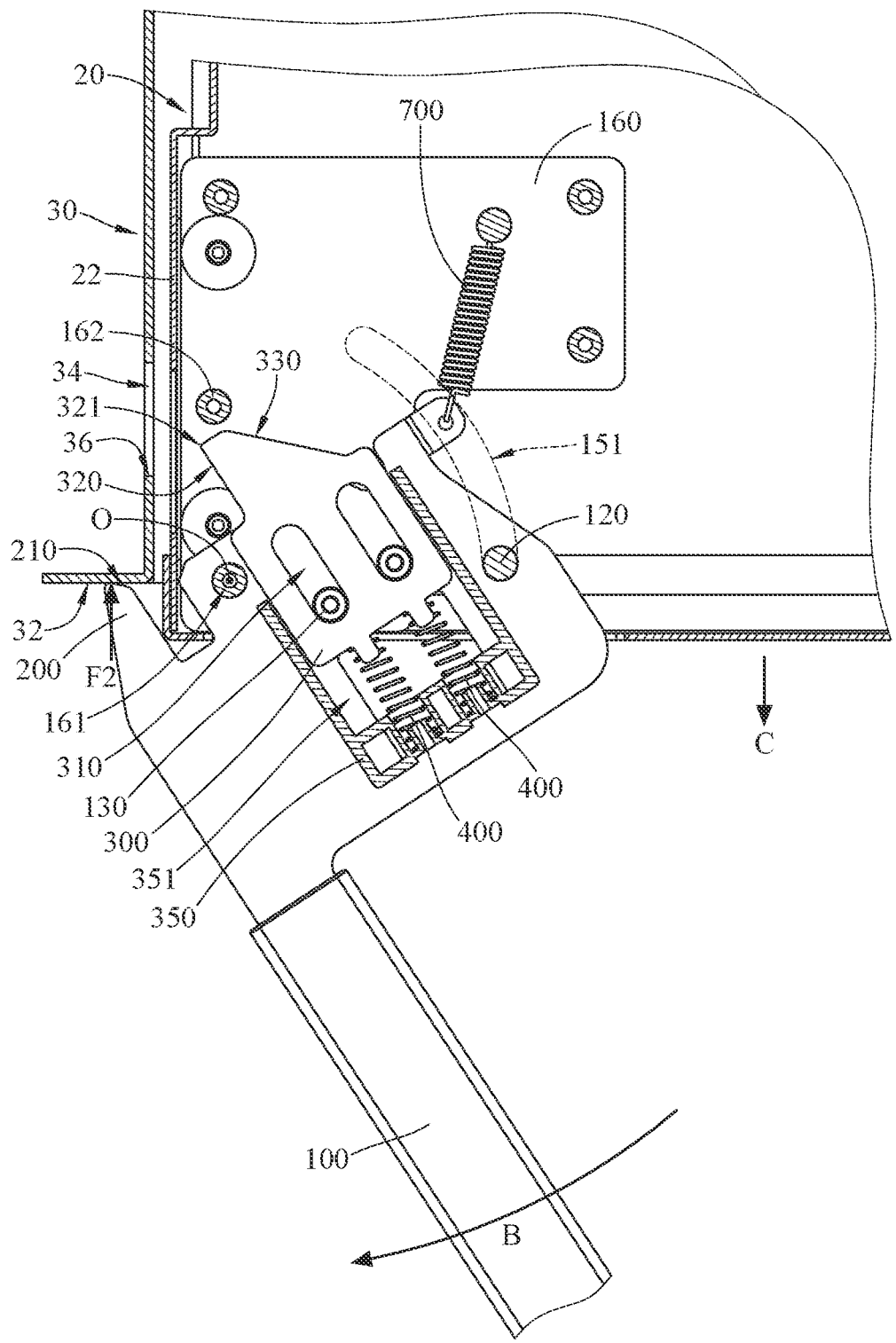

The handle mechanisms 10 are similar in configuration, thus only one of them will be described in detail in the follow paragraphs. In this embodiment, the handle mechanism 10 includes a handle 100 and an engagement component 300. The handle 100 is adapted to be pivotably disposed on the tray 20 so as to have an engaged position (as shown in FIG. 4) and a disengaged position (as shown in FIG. 8). In more detail, the casing assembly 1 may further include a first mount component 150 and a second mount component 160, the first mount component 150 is fixed on the slidable plate 22 of the tray 20 via, for example, screws or other suitable fasteners, the second mount component 160 is fixed on the first mount component 150, and the handle 100 is located between the first mount component 150 and the second mount component 160. In addition, the second mount component 160 has a shaft 161, the handle 100 has a through hole 110, and the shaft 161 is disposed through the through hole 110 and fixed on the first mount component 150 via screws or other suitable fasteners, such that the handle 100 is pivotable about an axis O relative to the first mount component 150 and the second mount component 160. As shown, the handle 100 may be pivoted in a direction R about the axis O.

In this embodiment, the handle 100 further has a first guide structure 120, and the first mount component 150 further has a second guide structure 151, the first guide structure 120 and the second guide structure 151 are respectively, for example, a pillar and a curved slot for the pillar to be slidably disposed through and moved along the curved slot, such that the pivoting movement of the handle 100 can be guided by the cooperation of the first guide structure 120 and the second guide structure 151. Note that the first guide structure and the second guide structure are optional and may be omitted in some other embodiments.

Note that the handle mechanism 10 is not restricted to be mounted on the slidable plate 22 of the tray 20; in some other embodiments, the handle mechanism may be mounted on another suitable structure, such as the bottom plate of the tray.

In this embodiment, the casing assembly 1 further includes a protrusion 200, the protrusion 200 and the handle 100 are respectively different portions of the same plate piece; that is, the protrusion 200 is integrally formed with the handle 100. The protrusion 200 has a pressing surface 210 configured to press against the bent portion 32 of the chassis 30 so as to force the tray 20 to slide out of the chassis 30.

Note that the protrusion 200, in other embodiments, may be additionally fixed to the handle 100 via, screw, rivet, or any suitable manner.

The engagement component 300 is slidably disposed on the handle 100 and is adapted to be disposed through the opening 24 so as to press against the contact surface 36 of the chassis 30 that is located in the engagement hole 34 and located close to the bent portion 32 to force the tray 20 to slide into the chassis 30. Specifically, the casing assembly 1 may further include a cover 350 and a plurality of first elastic components 400, the cover 350 is fixed on the handle 100 and has a guide recess 351, the engagement component 300 is slidably located in the guide recess 351, the engagement component 300 may have a width substantially equal to that of the guide recess 351, such that the engagement component 300 can be linearly moved along a direction D1. Each of the first elastic components 400 has an end connected to the engagement component 300 and another end connected to the cover 350. The first elastic components 400 are, for example, compression springs. When the engagement component 300 is forced to be moved along a direction opposite to the direction D1, the engagement component 300 and the cover 350 together compress the first elastic component 400, such that the first elastic component 400 stores a resilient force. When the engagement component 300 is released, the first elastic component 400 forces the engagement component 300 to move along the direction D1 relative to the handle 100.

Note that the quantity of the first elastic components 400 may be adjusted as required; in some other embodiments, the casing assembly may have one or more than two first elastic components.

Note that the location of the first elastic components 400 may be modified as required; in some other embodiments, the two opposite ends of each of the first elastic component may be respectively connected to the engagement component and the handle.

In this or another embodiment, the handle 100 may further have two first guide portions 130, and the engagement component 300 has two second guide portions 310. The first guide portions 130 are, for example, protrusions, and the second guide portions 310 are, for example, straight slots for the protrusions to be slidably disposed through and moved along the straight slots, such that the engagement component 300 is linearly slidable relative to the handle 100 by the cooperation of the first guide portions 130 and the second guide portions 310. That is, the first guide portions 130 can guide the second guide portions 310 to slide the engagement component 300 linearly relative to the handle 100.

In this embodiment, the engagement component 300 has a contact surface 320 and an inclined surface 330, the inclined surface 330 faces away from the contact surface 320, the contact surface 320 has an edge 321 located away from the axis O of the handle 100. When the handle 100 is in the engaged position and the engagement component 300 is engaged into the engagement hole 34 of the chassis 30, and the engagement component 300 is held by a stopper 162 disposed on the second mount component 160, and the contact surface 320 of the engagement component 300 faces the contact surface 36. The stopper 162 is provided to hold the engagement component 300 so as to restrict the length that the engagement component 300 protrudes out of the opening 24 (or the engagement hole 34).

When the handle 100 is in the disengaged position, the engagement component 300 is released from the engagement hole 34, and the engagement component 300 is separated from the stopper 162. When the handle 100 is in the engaged position and the tray 20 is being moved into the chassis 30, the inclined surface 330 of the engagement component 300 is pressed by the bent portion 32 of the chassis 30 so as to force the engagement component 300 to slide along the direction opposite to the direction D1.

Note that the quantities of the first guide portions 130 and the second guide portions 310 may be changed as required; in some other embodiments, the handle may have one or more than two first guide portions and have one or more than two second guide portions. Note that the engagement component 300 may be only guided be either the first guide portion 130 and the second guide portion 310 or the cover 350; that is, in some other embodiments, the first guide portion 130 and the second guide portion 310 or the cover 350 may be omitted.

Note that the movable direction of the engagement component 300 may be modified as required; in some other embodiment, the engagement component may be slidable along a curved path.

Note that the position of the stopper 162 may be changed as required; in some other embodiments, the stopper may be located on the tray or another component fixed to the tray.

In this embodiment, the stopper 162 can limit the position of the engagement component 300 relative to the chassis 30; that is, the stopper 162 can prevent the engagement component 300 from overly protruding from the engagement hole 34 while the handle 100 is in the engaged position. Thus, while the tray 20 is being moved into the chassis 30, the engagement component 300 is prevented from hitting the component nearby the chassis 30, such as the rack, the outer casing of the server, or the disk drive carrier. Note that the stopper 162 is optional and may be omitted; in the case that the second mount component does not have the stopper 162, the engagement component may still be moved along the direction opposite to the direction D1 by being guided by the component (e.g., the rack, the outer casing of the server, or the disk drive carrier) near the chassis during the movement of the tray into the chassis.

In this embodiment, the casing assembly 1 may further include a latch 500 and a plurality of second elastic components 600. The latch 500 includes a main body 510 and a first engagement structure 520 connected to each other. The main body 510 is slidably disposed on the handle 100 and is slidable relative to the handle 100 in a direction D2. The first engagement structure 520 is configured to be engaged with a second engagement structure 26 of the tray 20 (as shown in FIG. 4) so as to being indirectly engaged with the slidable plate 22 and fix the position of the handle 100 relative to the tray 20. Each of the second elastic components 600 has an end connected to the main body 510 of the latch 500 and another end connected to the handle 100. The second elastic components 600 are, for example, compression springs. When there is no external force applied on the latch 500, the second elastic components 600 force the first engagement structure 520 of the latch 500 to engage with the second engagement structure 26 of the tray 20 so as to fix the position of the handle 100 relative to the tray 20.

Note that the quantity of the second elastic components 600 may be adjusted as required; in some other embodiments, the casing assembly may have one or more than two second elastic components.

In this embodiment, the casing assembly 1 may further include an elastic component 700. The elastic component 700 has an end connected to the first mount component 150 and another end connected to the handle 100. The elastic component 700 is, for example, an extension spring. When the first engagement structure 520 of the latch 500 is disengaged from the second engagement structure 26 of the tray 20, the elastic component 700 forces the handle 100 to pivot toward the disengaged position, or helps the handle 100 move toward the disengaged position.

Note that the protrusion 200 is optional and may be omitted. In the case that the casing assembly 1 has the elastic component 700 or there is no need to save effort while pulling the tray 20 out of the chassis 30, the protrusion 200 may be omitted. In addition, when there is no need to eject the handle in some other cases, the elastic component 700 may be omitted.

Figure 5:
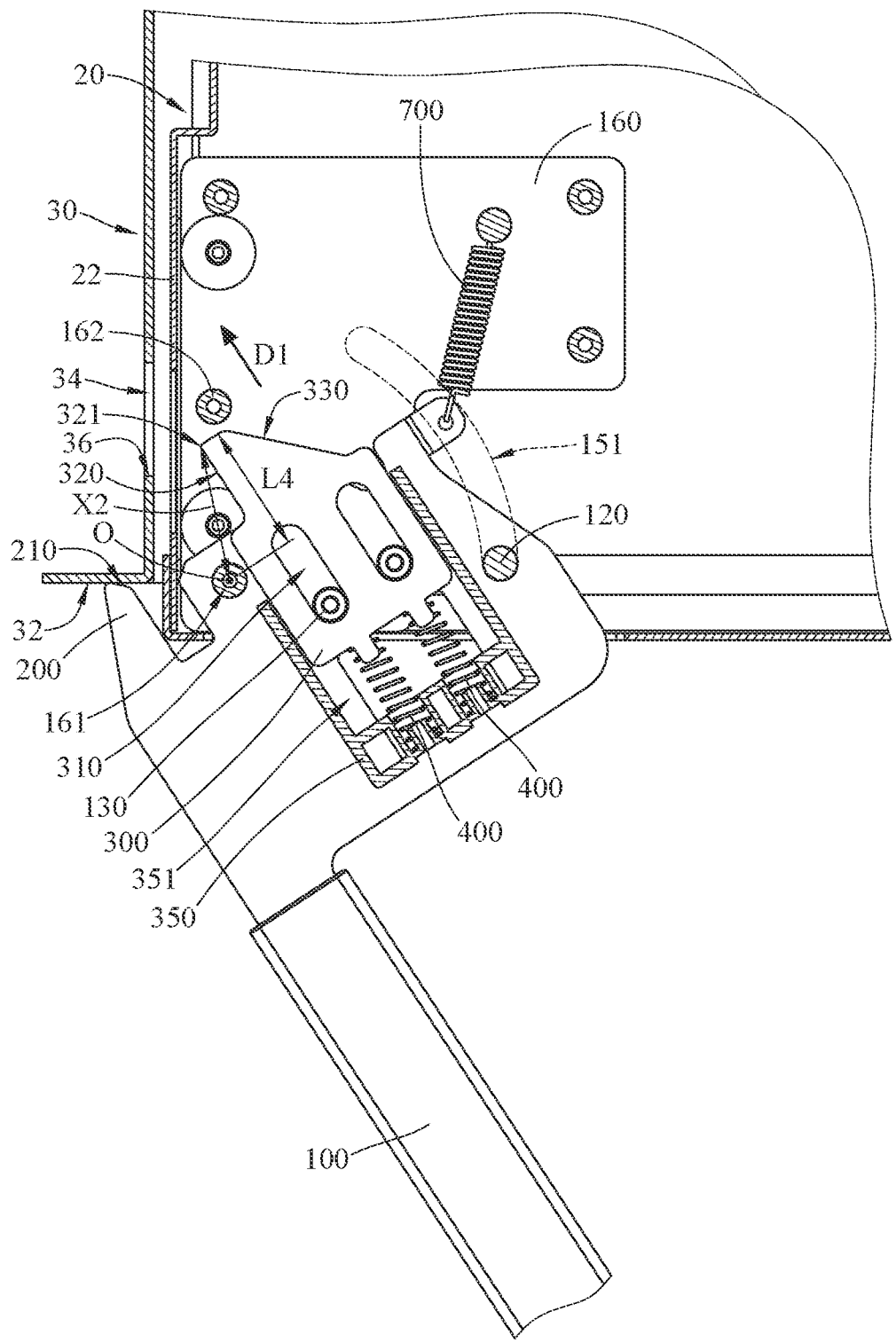
FIG. 5 is a cross-sectional view of the casing assembly and the chassis in FIG. 2 when a handle of the casing assembly is in a disengaged position.

Referring to FIGS. 4 and 5, where FIG. 5 depicts a cross-sectional view of the casing assembly 1 and the chassis 30 when the handle 100 of the casing assembly 1 is in the disengaged position. As shown in FIG. 4, the handle 100 is in the engaged position, the first engagement structure 520 of the latch 500 is engaged with the second engagement structure 26 of the tray 20, and the engagement component 300 is engaged with the engagement hole 34 of the chassis 30. At this moment, the stopper 162 holds the engagement component 300, the distance X1 between the edge 321 of the contact surface 320 of the engagement component 300 and the axis O becomes shorter, and the ratio of the distance L1 between the first engagement structure 520 and the axis O to the distance L2 between the part of which the contact surface 320 of the engagement component 300 contacts the contact surface 36 and the axis O along the direction D1 is increased to above 10. That is, L1/L2 may be equal to or at least larger than 10. This makes moving the handle mechanism 10 to slide the tray 20 into the chassis 30 an effortless operation. In addition, the stopper 162 is not the only factor to shorten the distance L2. The position of the axis O designed to be located away from the latch 500 is also the factor to shorten the distance L2. That is, the position of the axis O become closer to the protrusion 200. As a result, the ratio of the distance L1 to the minimum distance L3 between the pressing surface 210 of the protrusion 200 and the axis O is above 10, making moving the handle mechanism 10 to slide the tray 20 out of the chassis 30 an effortless operation.

On the other hand, as shown in FIG. 5, when the handle 100 is in the disengaged position, the engagement component 300 is separated from the stopper 162, such that the first elastic components 400 force the engagement component 300 to move in the direction D1 so as to increase the distance X2 between the edge 321 of the contact surface 320 and the axis O. That is, the distance L4 between the part of which the contact surface 320 of the engagement component 300 contacts the contact surface 36 and the axis O in the direction D1 is also increased, such that the movable distance of the tray 20 into the chassis 30 caused by the handle mechanism 10 is increased to above 10 millimeters. In addition, if required, the minimum distance between the pressing surface 210 of the protrusion 200 and the axis O may be longer, such that the movable distance of the tray 20 out of the chassis 30 caused by the handle mechanism 10 can be increased to above 10 millimeters.

Referring to FIGS. 6 to 10, the operation of the handle mechanism 10 of the casing assembly 1 is shown.

Figure 6:
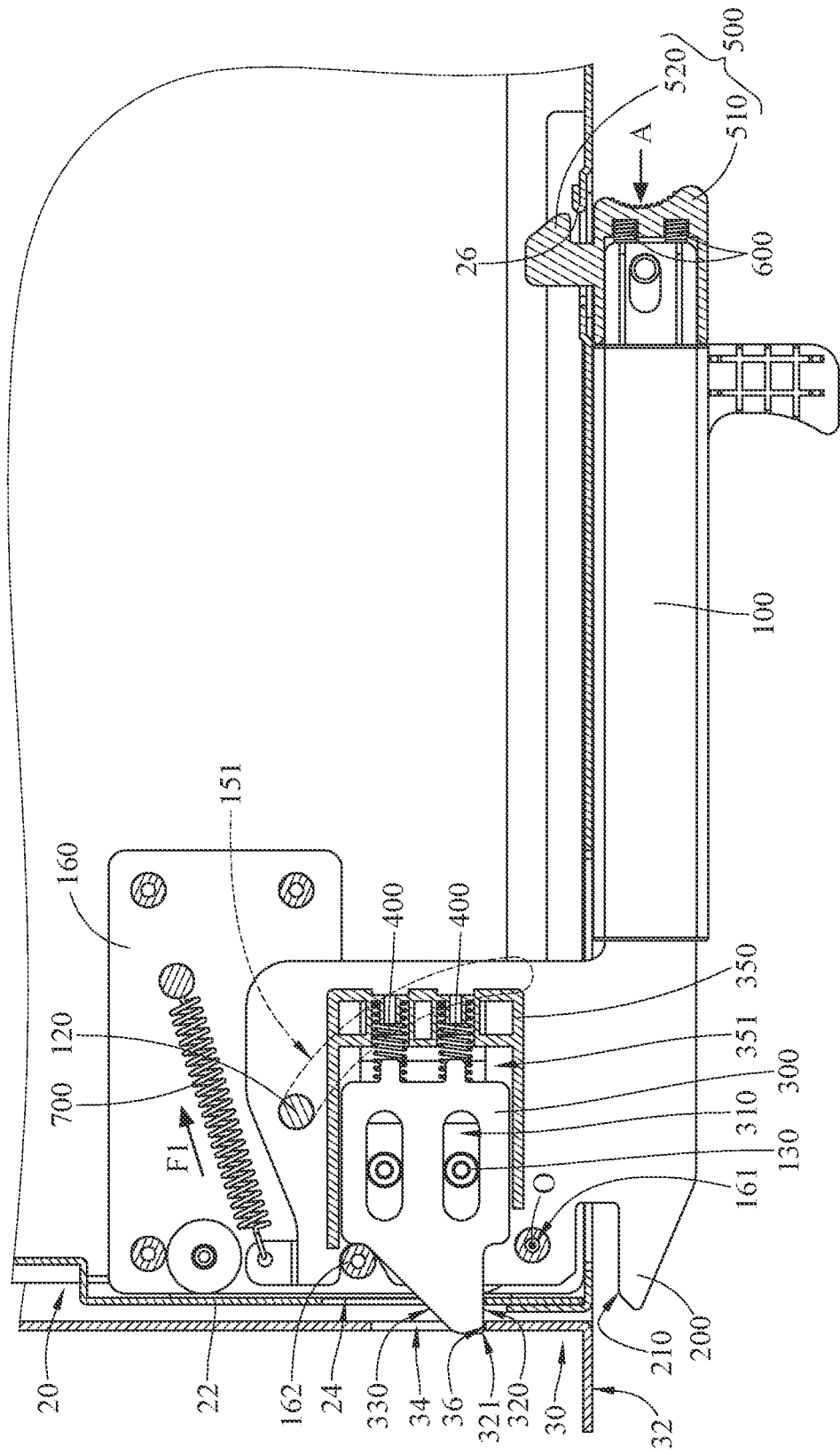
FIGS. 6 to 10 shows an operation of a handle mechanism of the casing assembly.
Figure 7:
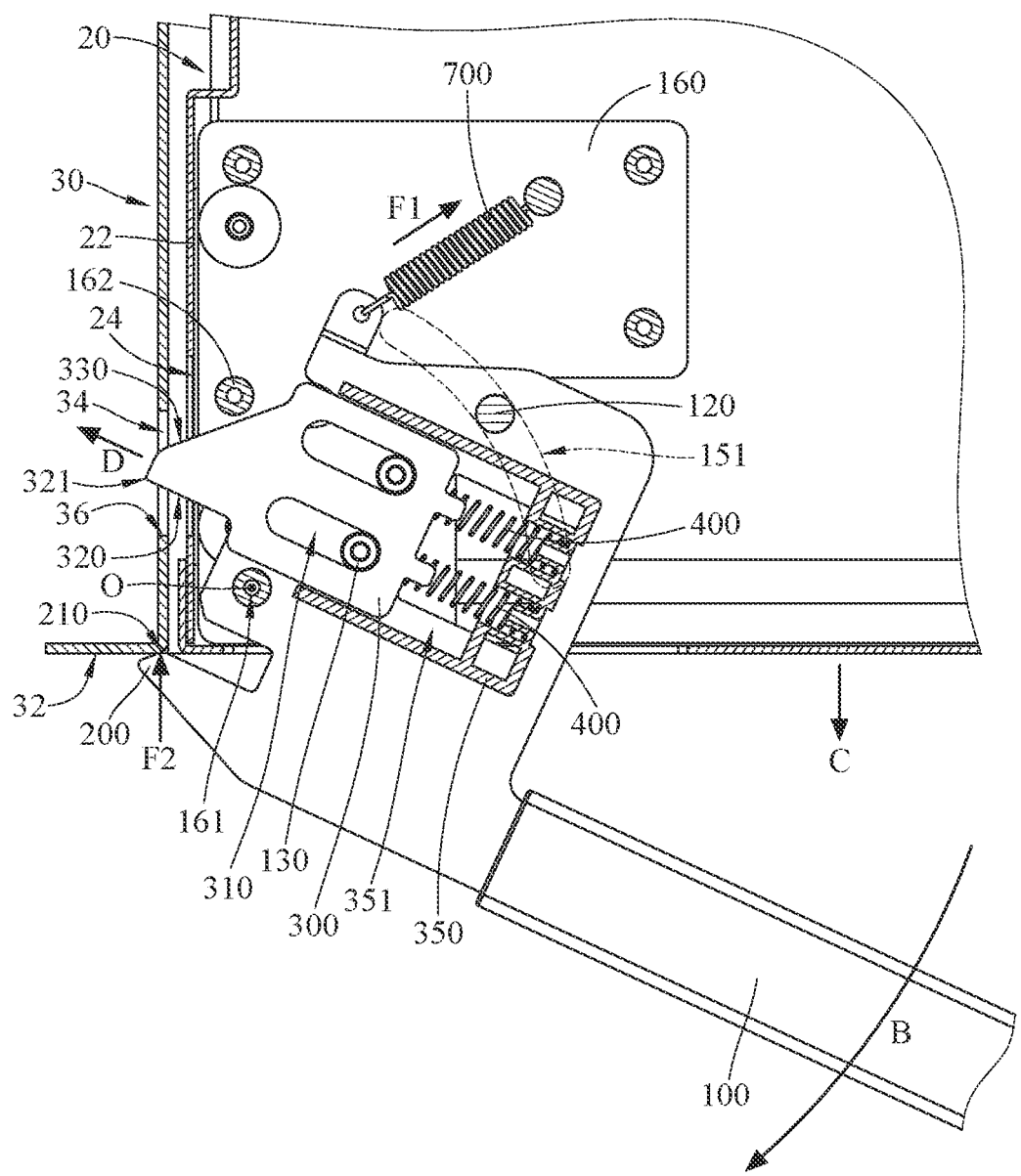

As shown in FIG. 4, the handle 100 is in the engaged position, the first engagement structure 520 of the latch 500 is engaged with the second engagement structure 26 of the tray 20, and the engagement component 300 is engaged with the engagement hole 34 of the chassis 30. At this moment, the stopper 162 stops the engagement component 300 so as to prevent it from hitting or having interference with the component nearby the chassis 30. Then, as shown in FIGS. 6-7, the latch 500 is moved in a direction A to disengage the first engagement structure 520 of the latch 500 from the second engagement structure 26 of the tray 20. At this moment, the elastic component 700 is released and applied a forces in a direction F1 on the handle 100, such that the handle 100 is forced to pivot along a direction B. This movement of the handle 100 may be caused by hand. Then, the pivoting of the handle 100 in the direction B causes the pressing surface 210 of the protrusion 200 of the handle mechanism 10 to contact the bent portion 32 of the chassis 30. Then, as shown in FIG. 8, the handle 100 may be further pivoted to force the pressing surface 210 of the protrusion to press against the bent portion 32 of the chassis 30 along a direction F2. By doing so, the tray 20 is forced to slide outward relative to the chassis 30 along a direction C. And the operation of the handle mechanism 10 to force the tray 20 to slide relative to the chassis 30 along the direction C is effortless. The movement of the tray 20 caused by the handle mechanism 10 can also disconnect the electronic components therein from the mating electronic components in the chassis 30 or the rack.

Figure 9:
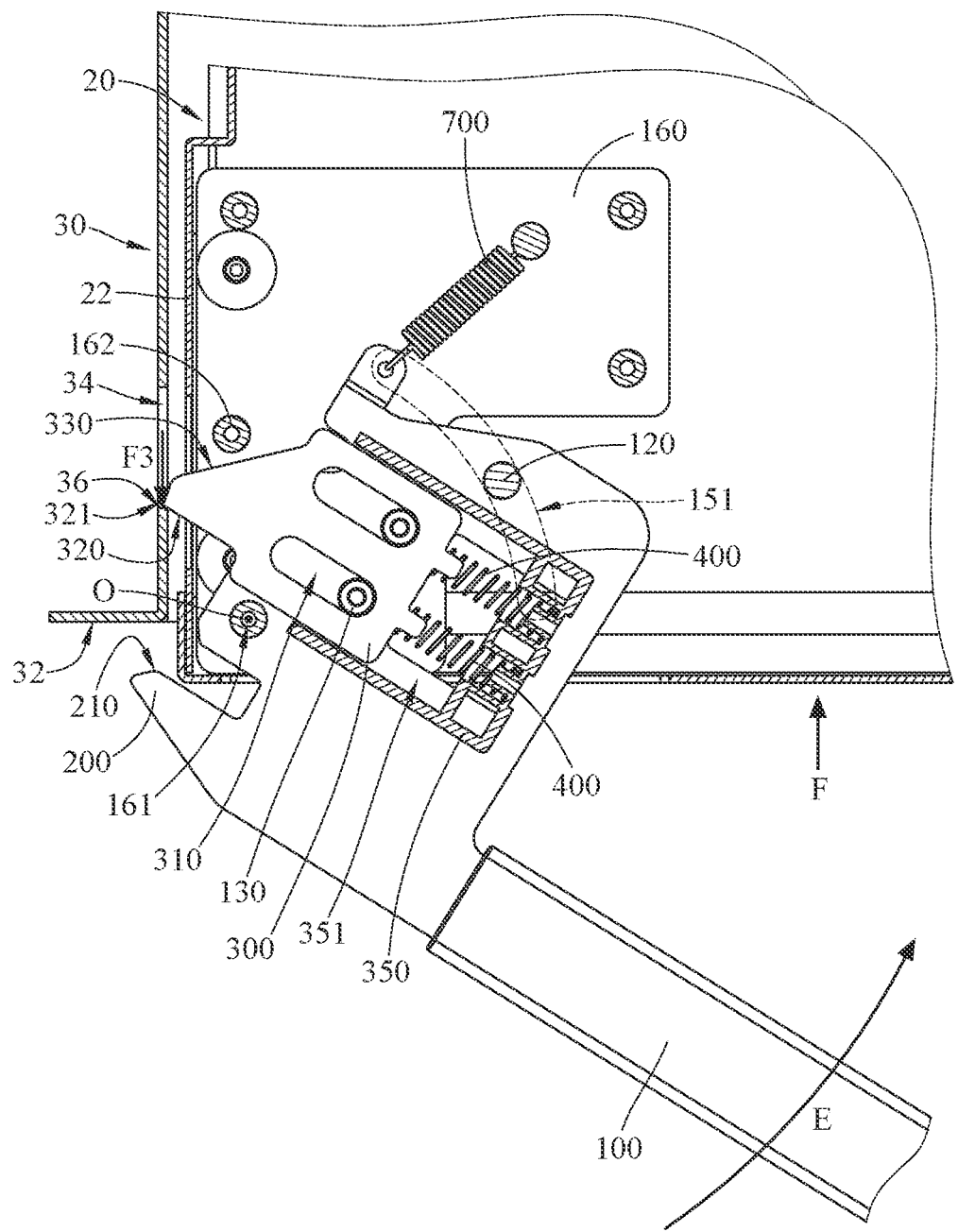
Figure 10:
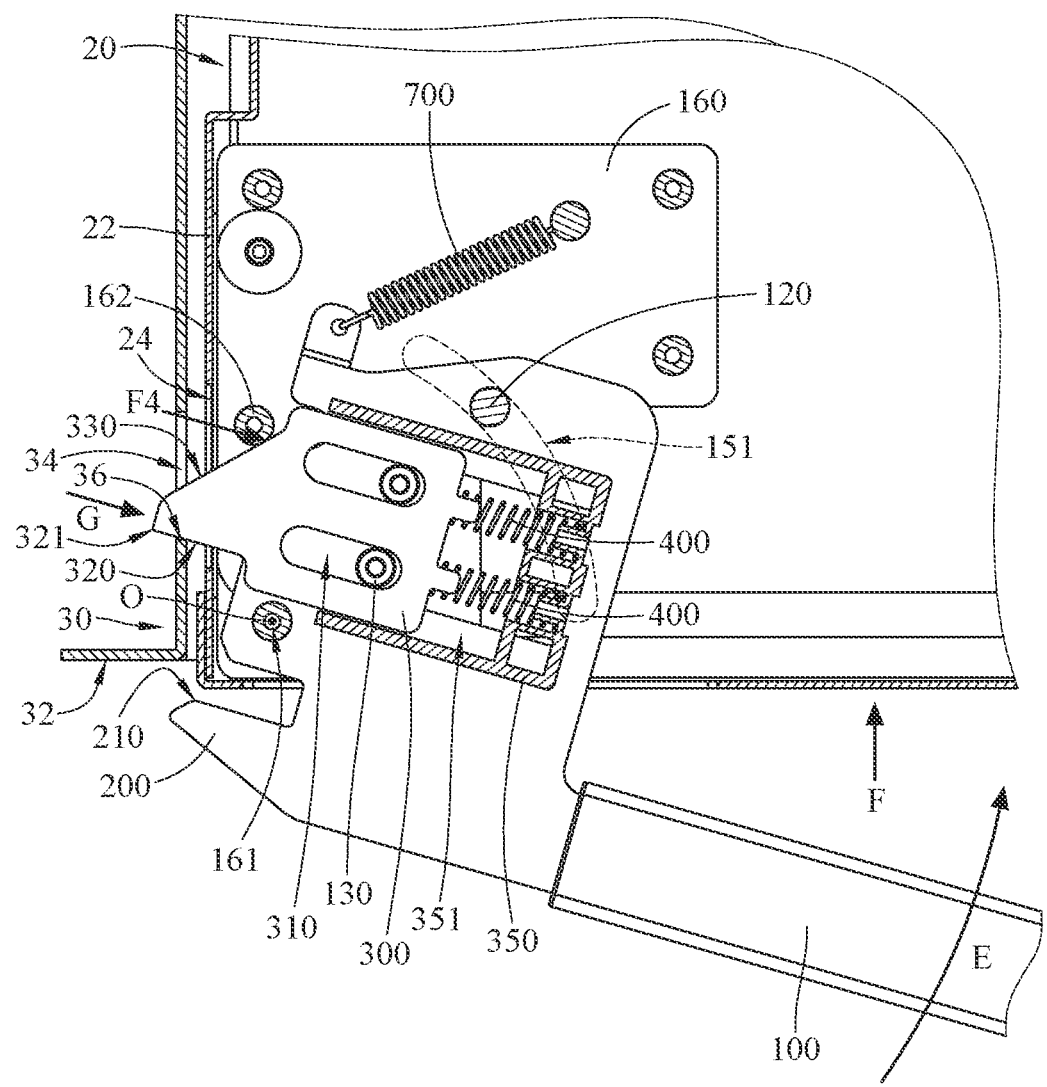

Then, as shown in FIG. 9, the tray 20 may be put back into the chassis 30 by pivoting the handle 100 along a direction E. By doing so, the contact surface 320 of the engagement component 300 presses against the contact surface 36 (along a direction F3), such that the tray 20 is forced to slide into the chassis 30 along a direction F. During this process, the engagement component 300 is staying away from the stopper 162, and the distance X4 (as shown in FIG. 5) between the edge 321 of the contact surface 320 of the engagement component 300 and the axis O is longer due to the release of the resilient force of the first elastic components 400, thus the engagement component 300 can contact the contact surface 36 as early as possible when pivoting the handle 100 along the direction E, thereby elongating the moving inward distance of the tray 20 caused by the handle mechanism 10. Then, as shown in FIG. 10, further pivoting the handle 100 along the direction E forces the stopper 162 to press against the engagement component 300 (e.g., along a direction F4) to move the engagement component 300 along a direction G, such that the distance between the edge 321 of the contact surface 320 of the engagement component 300 and the axis O gradually decrease, and the stopper 162 can restrict the length of the engagement component 300 protruding out of the engagement hole 34, thereby preventing the engagement component 300 from hitting the component nearby the chassis 30. By doing so, the tray 20 is forced to slide into the chassis 30 along the direction F. And the operation of the handle mechanism 10 to force the tray 20 to slide into the chassis 30 along the direction F is effortless. The movement of the tray 20 caused by the handle mechanism 10 can also connect the electronic components therein with the mating electronic components in the chassis 30 or the rack.

As discussed, when the handle 100 is pivoted toward the disengaged position from the engaged position, the distance between the edge 321 of the contact surface 320 of the engagement component 300 gradually increases, such that the distance that the handle mechanism 10 moves the tray 20 into the chassis 30 is increased. On the other hand, when the handle 100 is pivoted toward the engaged position from the disengaged position, the distance between the edge 321 of the contact surface 320 of the engagement component 300 and the axis O gradually decreases; that is, the distance between the edge 321 of the contact surface 320 of the engagement component 300 and the axis O of the handle 100 in the engaged position is smaller than the distance between the edge 321 of the contact surface 320 of the engagement component 300 and the axis O of the handle 100 in the disengaged position, such that the engagement component 300 can be prevented from hitting or having interference with the component nearby the chassis 30. Therefore, the movement distance of the tray 20 caused by operating the handle mechanism 10 can be increased while achieving the effortless operation of the handle mechanism 10.

Figure 11:
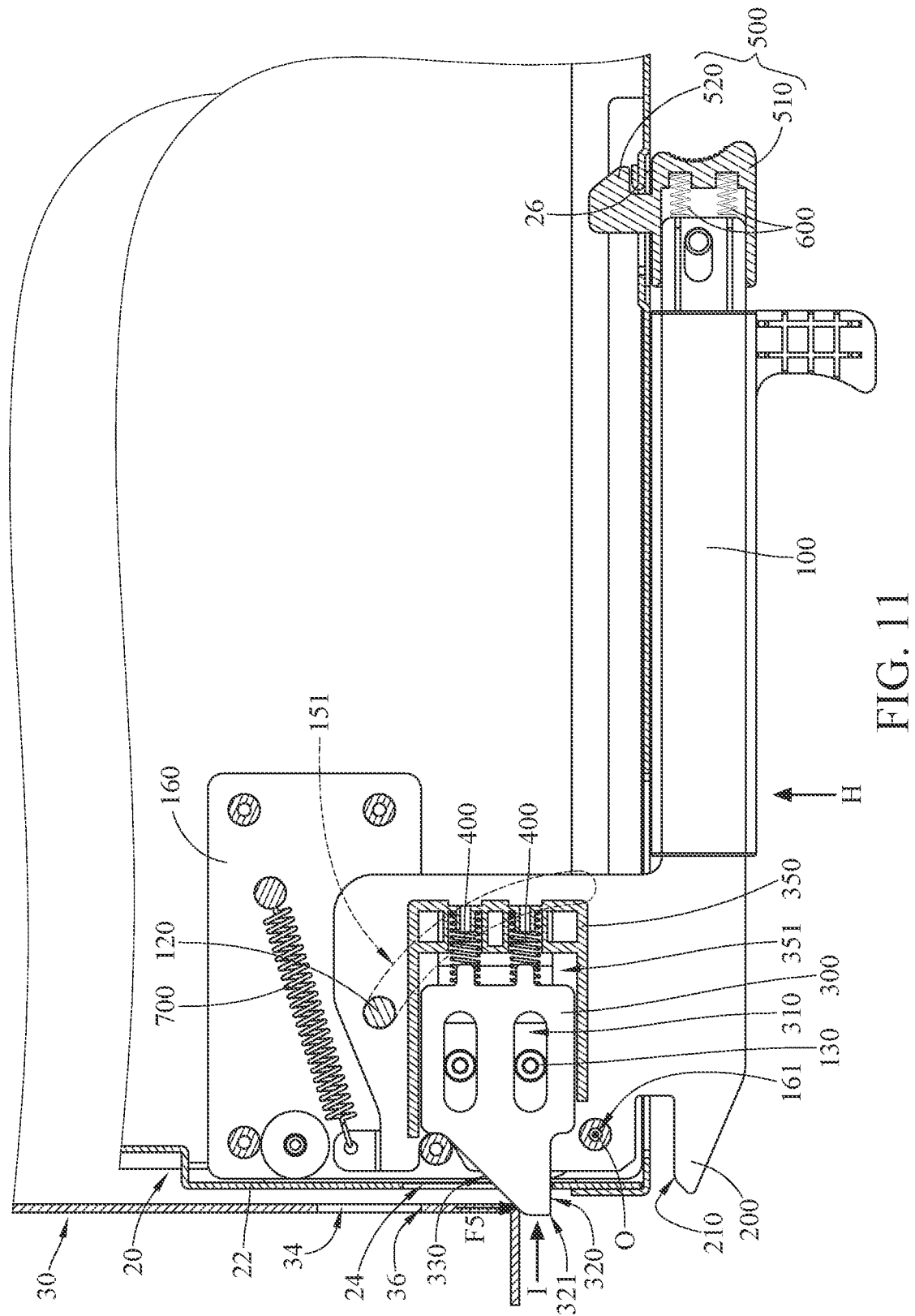
FIGS. 11 and 12 shows another operation of the handle mechanism of the casing assembly.
Figure 12:
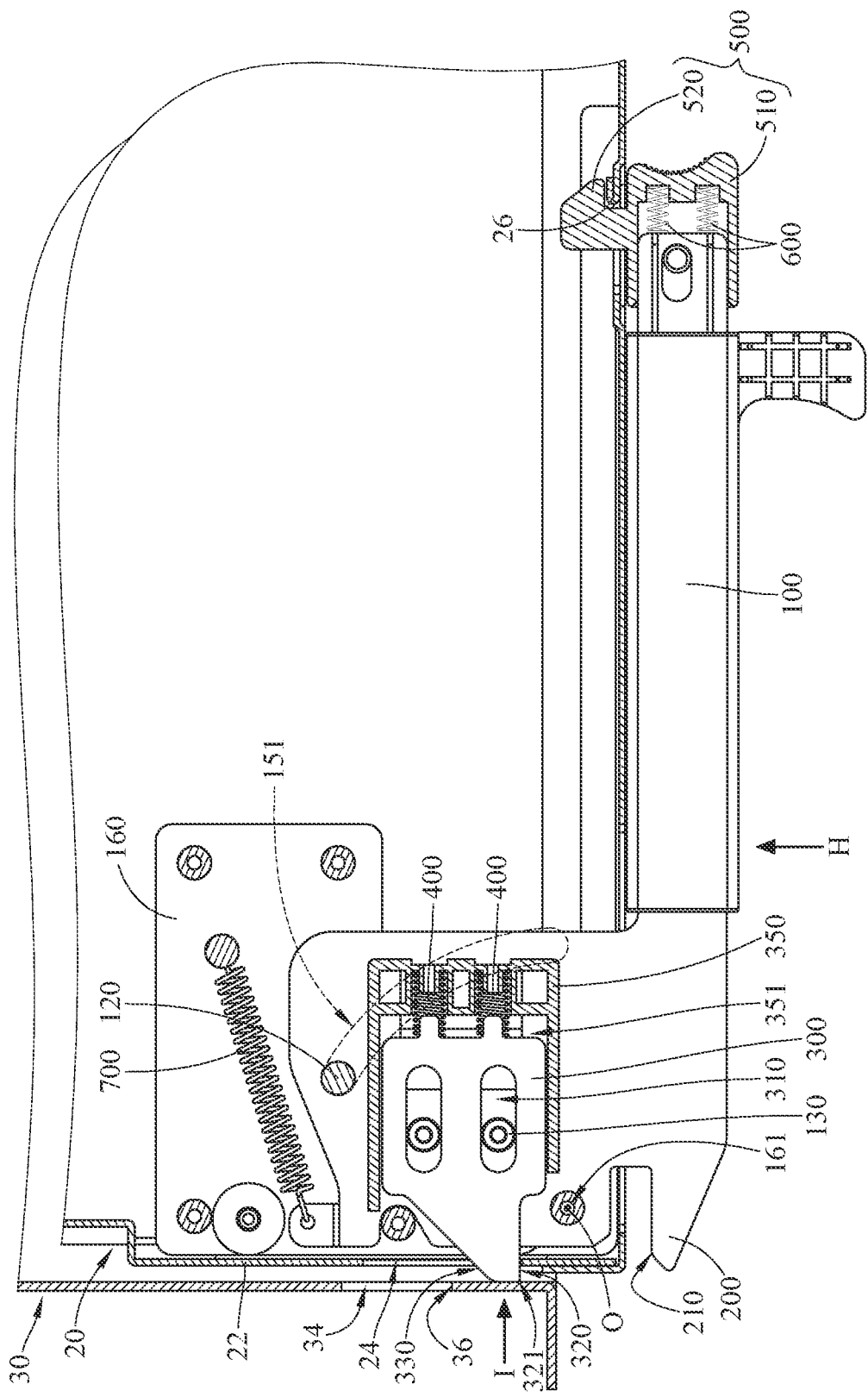

Referring to FIGS. 11 and 12, another operation of the handle mechanism 10 of the casing assembly 1 is shown.

As shown in FIGS. 11 and 12, the tray 20 may be directly pushed into the chassis 30 along a direction H while the handle 100 is in the engaged position. The engagement component 300 is slidably disposed on the handle 100, thus when the tray 20 is moved along the direction H, the inclined surface 330 of the engagement component 300 is pressed by the bent portion 32 of the chassis 30 (e.g., along a direction F5), such that the engagement component 300 is forced to move along a direction I, thereby preventing the engagement component 300 from interfering with the chassis 30. After the engagement component 300 is moved to align with the engagement hole 34 of the chassis 30, the first elastic components 400 force the engagement component 300 to insert into the engagement hole 34 of the chassis 30. As such, even the handle 100 is in the engaged position, the tray 20 can still be moved into the chassis 30 without being blocked. In addition, when the casing assembly 1 is located at a high place that is difficult to operate the handle mechanism 10, it is allowed to directly push the tray 20 into the chassis 30 without operating the handle mechanism 10.

According to the handle mechanism and the casing assembly as disclosed above, the engagement component is slidably disposed on the handle, such that even the handle is in the engaged position, during the movement of the tray into the chassis, the bent portion of the chassis presses against the inclined surface of the engagement component so as to force the engagement component to move away, thereby preventing the engagement component from interfering with the chassis. After the engagement component is moved to align with the engagement hole of the chassis, the first elastic components force the engagement component to insert into the engagement hole of the chassis. Therefore, when the handle is in the engaged position, and the maintainer is inconvenient or does not want to open the handle, the tray can still be moved into the chassis without being blocked.

In addition, when the handle is pivoted toward the disengaged position from the engaged position, the distance between the edge of the contact surface of the engagement component and the axis of the handle gradually increase. Therefore, the movement distance of the tray into the chassis caused by operating the handle mechanism can be increased. On the other hand, when the handle is pivoted toward the engaged position from the disengaged position, the distance between the edge of the contact surface of the engagement component and the axis of the handle gradually decreases. As such, the engagement component can be prevented from hitting or having interference with the component nearby the chassis. Therefore, the movement distance of the tray caused by operating the handle mechanism can be increased while achieving the effortless operation of the handle mechanism.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A handle mechanism, adapted to be mounted on a slidable plate and configured to slide the slidable plate relative to a chassis, comprising:
   a handle, adapted to be pivotably disposed on the slidable plate so as to have an engaged position and a disengaged position; and
   an engagement component, slidably disposed on the handle and adapted to contact the chassis to slide the slidable plate into the chassis, wherein the engagement component has a contact surface, and the contact surface has an edge located away from an axis of the handle;
   wherein the axis of the handle is located outside an outer profile of the engagement component, a distance between the edge of the contact surface of the engagement component and the axis of the handle in the engaged position is smaller than a distance between the edge of the contact surface of the engagement component and the axis of the handle in the disengaged position.

2. The handle mechanism according to claim 1, wherein the handle further has at least one first guide portion, the engagement component has at least one second guide portion, and the at least one first guide portion of the handle is configured to guide the at least one second guide portion of the engagement component to slide the engagement component linearly relative to the handle.

3. The handle mechanism according to claim 1, further comprising a cover, wherein the cover is fixed on the handle and has a guide recess, and the engagement component is slidably located in the guide recess.

4. The handle mechanism according to claim 3, further comprising at least one first elastic component, wherein an end of the at least one first elastic component is connected to the engagement component, another end of the at least one first elastic component is connected to the cover, and the at least one first elastic component is configured to force the engagement component to slide relative to the handle.

5. The handle mechanism according to claim 1, further comprising at least one first elastic component, wherein an end of the at least one first elastic component is connected to the engagement component, another end of the at least one first elastic component is connected to the handle, and the at least one first elastic component is adapted to force the engagement component to slide relative to the handle.

6. The handle mechanism according to claim 1, further comprising a first mount component and a second mount component, wherein the first mount component is adapted to be fixed on the slidable plate, the second mount component is fixed on the first mount component, and the handle is pivotably disposed on the first mount component or the second mount component.

7. The handle mechanism according to claim 6, wherein the second mount component has a shaft, the handle has a through hole, the shaft of the second mount component is disposed through the through hole of the handle so that the handle is pivotable relative to the first mount component and the second mount component.

8. The handle mechanism according to claim 1, further comprising a stopper, wherein the stopper is adapted to contact the engagement component to limit a position of the engagement component relative to the chassis.

9. The handle mechanism according to claim 4, further comprising a latch, wherein the latch is slidably disposed on the handle and is configured to be engaged with the slidable plate so as to fix the handle.

10. The handle mechanism according to claim 9, further comprising at least one second elastic component, wherein an end of the at least one second elastic component is connected to the latch, another end of the at least one second elastic component is connected to the handle, and the at least one second elastic component is configured to force the latch to slide relative to the handle.

11. The handle mechanism according to claim 6, further comprising an elastic component, wherein an end of the elastic component is connected to the second mount component, another end of the elastic component is connected to the handle, and the elastic component is adapted to pivot the handle toward the disengaged position.

12. The handle mechanism according to claim 1, further comprising a protrusion, wherein the protrusion is integrally connected to the handle, and the protrusion is adapted to be in contact with the chassis to force the slidable plate to slide out of the chassis.

13. A casing assembly, adapted to be slidably disposed in a chassis, comprising:
- a tray, slidably disposed in the chassis; and
- a handle mechanism, comprising:
  - a handle, adapted to be pivotably disposed on the tray so as to have an engaged position and a disengaged position; and
  - an engagement component, slidably disposed on the handle and adapted to contact the chassis to slide the tray into the chassis, wherein the engagement component has a contact surface, and the contact surface has an edge located away from an axis of the handle;
  - wherein the axis of the handle is located outside an outer profile of the engagement component, a distance between the edge of the contact surface of the engagement component and the axis of the handle in the engaged position is smaller than a distance between the edge of the contact surface of the engagement component and the axis of the handle in the disengaged position.

14. The casing assembly according to claim 13, wherein the handle further has at least one first guide portion, the engagement component has at least one second guide portion, and the at least one first guide portion of the handle is configured to guide the at least one second guide portion of the engagement component to slide the engagement component linearly relative to the handle.

15. The casing assembly according to claim 13, further comprising a cover, wherein the cover is fixed on the handle and has a guide recess, and the engagement component is slidably located in the guide recess.

16. The casing assembly according to claim 15, further comprising at least one first elastic component, wherein an end of the at least one first elastic component is connected to the engagement component, another end of the at least one first elastic component is connected to the cover, and the at least one first elastic component is adapted to force the engagement component to slide relative to the handle.

17. The casing assembly according to claim 13, further comprising at least one first elastic component, wherein an end of the at least one first elastic component is connected to the engagement component, another end of the at least one first elastic component is connected to the handle, and the at least one first elastic component is adapted to force the engagement component to slide relative to the handle.

18. The casing assembly according to claim 13, further comprising a first mount component and a second mount component, wherein the first mount component is adapted to be fixed on the tray, the second mount component is fixed on the first mount component, and the handle is pivotably disposed on the first mount component or the second mount component.

19. The casing assembly according to claim 18, wherein the second mount component has a shaft, the handle has a through hole, the shaft of the second mount component is disposed through the through hole of the handle so that the handle is pivotable relative to the first mount component and the second mount component.

20. The casing assembly according to claim 13, further comprising a stopper, wherein the stopper is adapted to contact the engagement component to limit a position of the engagement component relative to the chassis.

* * * * *